(12) United States Patent
Tanzawa

(10) Patent No.: US 9,171,587 B2
(45) Date of Patent: Oct. 27, 2015

(54) VERTICAL MEMORY WITH BODY CONNECTION

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/451,208

(22) Filed: Aug. 4, 2014

(65) Prior Publication Data

US 2014/0347926 A1    Nov. 27, 2014

Related U.S. Application Data

(63) Continuation of application No. 13/561,946, filed on Jul. 30, 2012, now Pat. No. 8,797,804.

(51) Int. Cl.
| | | |
|---|---|---|
| *G11C 16/06* | (2006.01) | |
| *G11C 5/06* | (2006.01) | |
| *H01L 29/66* | (2006.01) | |
| *H01L 29/788* | (2006.01) | |
| *H01L 29/792* | (2006.01) | |
| *H01L 27/115* | (2006.01) | |
| *G11C 16/08* | (2006.01) | |
| *G11C 16/04* | (2006.01) | |

(52) U.S. Cl.
CPC *G11C 5/06* (2013.01); *G11C 16/04* (2013.01); *G11C 16/06* (2013.01); *G11C 16/08* (2013.01); *H01L 27/1157* (2013.01); *H01L 27/11529* (2013.01); *H01L 27/11556* (2013.01); *H01L 27/11573* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
CPC .................... H01L 29/7926; H01L 29/42344; H01L 29/78696; H01L 2224/743
See application file for complete search history.

(56) References Cited

U.S. PATENT DOCUMENTS

| | | |
|---|---|---|
| 5,815,439 A | 9/1998 | Korsh et al. |
| 5,828,621 A | 10/1998 | Tanzawa et al. |
| 7,369,436 B2 | 5/2008 | Forbes |
| 7,489,556 B2 | 2/2009 | Tanzawa |
| 7,509,566 B2 | 3/2009 | Tanaka et al. |
| 7,575,973 B2 | 8/2009 | Mokhlesi et al. |

(Continued)

OTHER PUBLICATIONS

"Posts Tagged 'Global Foundries'", Semiconductor Manufacturing & Design, [Online]. Retrieved from the Internet: <URL: semimd.com/blog/tag/globalfoundries >, (Accessed May 25, 2012), 23 pgs.

(Continued)

*Primary Examiner* — Thong Q Le
(74) *Attorney, Agent, or Firm* — Schwegman Lundberg & Woessner, P.A.

(57) ABSTRACT

An embodiment of an apparatus includes a substrate, a body semiconductor, a vertical memory access line stack over the body semiconductor, and a body connection to the body semiconductor.

17 Claims, 13 Drawing Sheets

(56) References Cited

U.S. PATENT DOCUMENTS

| | | | |
|---|---|---|---|
| 7,829,938 | B2 | 11/2010 | Bhattacharyya |
| 7,851,851 | B2 | 12/2010 | Mokhlesi et al. |
| 7,906,818 | B2 | 3/2011 | Pekny |
| 7,916,544 | B2 | 3/2011 | Tanzawa |
| 7,952,933 | B2 | 5/2011 | Tanaka et al. |
| 8,013,579 | B2 | 9/2011 | Tanzawa |
| 8,797,804 | B2 * | 8/2014 | Tanzawa .................. 365/185.23 |
| 2009/0027959 | A1 | 1/2009 | Lee et al. |
| 2009/0310415 | A1 | 12/2009 | Jin et al. |
| 2010/0207194 | A1 | 8/2010 | Tanaka et al. |
| 2010/0244119 | A1 | 9/2010 | Fukuzumi et al. |
| 2010/0254191 | A1 | 10/2010 | Son et al. |
| 2010/0327340 | A1 | 12/2010 | Oota et al. |
| 2011/0002172 | A1 | 1/2011 | Kito et al. |
| 2011/0031550 | A1 | 2/2011 | Komori et al. |
| 2011/0149655 | A1 | 6/2011 | Tanzawa |
| 2011/0169067 | A1 | 7/2011 | Ernst et al. |
| 2011/0194357 | A1 | 8/2011 | Hau et al. |
| 2011/0272754 | A1 | 11/2011 | Tang et al. |
| 2011/0294290 | A1 | 12/2011 | Nakanishi et al. |
| 2011/0310670 | A1 | 12/2011 | Shim et al. |
| 2013/0001682 | A1 | 1/2013 | Tang et al. |
| 2014/0029352 | A1 | 1/2014 | Tanzawa |

OTHER PUBLICATIONS

Jang, J., et al., "Vertical cell array using TCAT(Terabit Cell Array Transistor) technology for ultra high density NAND flash memory", Symposium on VLSI Technology, (2009), 192-193.

Katsumata, R., et al., "Pipe-shaped BiCS flash memory with 16 stacked layers and multi-level-cell operation for ultra high density storage devices", Symposium on VLSI Technology, (Jun. 2009), 136-37.

Park, Se Hwan, et al., "Novel Three Dimensional (3D) NAND Flash Memory Array Having Tied Bit-line and Ground Select Transistor (TiGer)", IEICE (Abstract Only), [Online]. Retrieved from the Internet: <URL: search.ieice.org/bin/summary.php?id=e95-c_f_837&category=C&year=2012&lang=E&abst=>, (May 1, 2012), 1 pg.

Tanaka, H., et al., "Bit Cost Scalable Technology with Punch and Plug Process for Ultra High Density Flash Memory", IEEE Symposium on VLSI Technology, (2007), 14-15.

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.

* cited by examiner

VERTICAL MEMORY WITH BODY CONNECTION

PRIORITY APPLICATION

This application is a continuation of U.S. application Ser. No. 13/561,946, filed Jul. 30, 2012 and issued as U.S. Pat. No. 8,797,804, which is incorporated herein by reference in its entirety.

BACKGROUND

The semiconductor industry has a market driven need to reduce the size of devices, such as transistors, and increase the device density on a substrate. Some product goals include lower power consumption, higher performance, and smaller sizes. Various memory architectures have been proposed to increase the memory density in a memory device, some of which may sacrifice accurate operation for improved density.

DETAILED DESCRIPTION

Figure 1A:
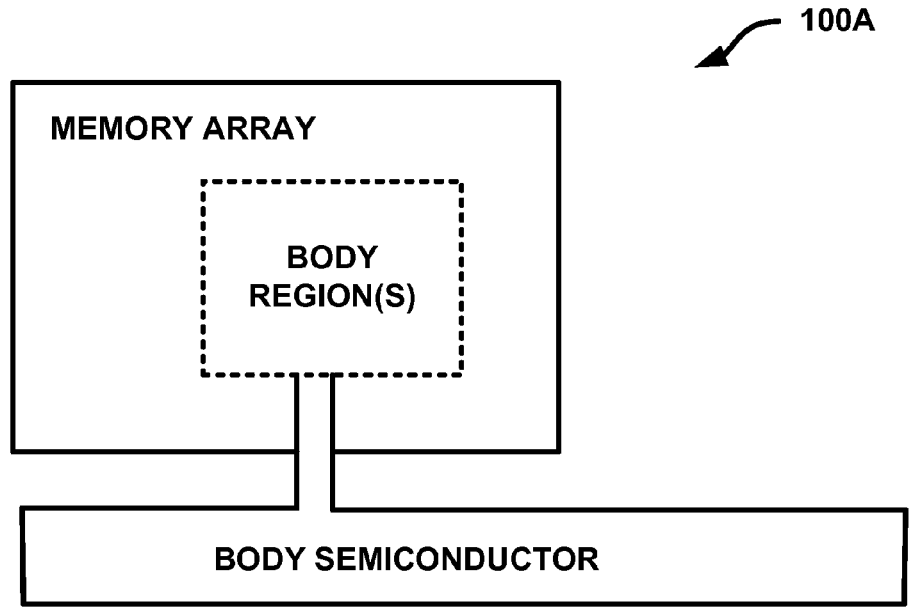
FIG. 1A illustrates, generally, a block diagram of an apparatus according to an example embodiment.

The following detailed description refers to the accompanying drawings which show, by way of illustration, specific aspects and embodiments in which the present subject matter may be practiced. These embodiments are described in sufficient detail to enable those skilled in the art to practice the present subject matter.

In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In some memory architectures that operate to improve storage density, including vertical memory architectures, it may be desirable to control the body potential to promote accurate read and write operations. Controlling the body potential may increase the number of possible data states (which are sometimes referred to herein as "levels") compared to an apparatus that has a floating body potential. Thus, embodiments of memory apparatuses and fabrication techniques are disclosed herein that have pillar body connections formed into a memory apparatus. Also disclosed herein are embodiments of methods of using a memory apparatus with a pillar body connection.

An embodiment of an apparatus (e.g., circuitry, a die or dies, a module or modules, a device or devices, a system or systems, a combination thereof, or the like), by way of example, includes a body semiconductor, a vertical memory access line stack over the body semiconductor, and a body connection to the body semiconductor. The body connection may comprise a body pillar connected to the body semiconductor.

Another embodiment of an apparatus, for example, may include a substrate, a p-type body over the substrate, an n-type source over the body, the source including an opening extending from a top surface of the source to the body, a vertical NAND (VNAND) memory access line stack over the source, wherein the opening in the source is at an edge of or outside a footprint of the VNAND memory access line stack, a p-type body pillar connected to the body through the opening in the source, and a body contact connected to the body pillar to create an electrical connection to the body.

An embodiment of a method, by way of example, includes forming a body semiconductor, forming a source semiconductor over the body semiconductor, forming a memory access line stack over the source semiconductor, forming an opening through the memory access line stack and the source semiconductor to the body semiconductor, forming a first semiconductor pillar in the opening, and forming a second semiconductor pillar to contact the body semiconductor.

In several embodiments, flash memory operates to store information in an array of transistors, called "cells," each of which stores one or more bits (or portions of bits) of information. NOR flash and NAND flash are two types of flash memory apparatuses. NOR and NAND refer to the type of logic used in the storage cell array. Flash memory is non-volatile, which means that it stores information in a way that does not need power to maintain the stored information.

A flash memory cell includes a control gate (CG), as in other MOS (metal oxide semiconductor) transistors, but also includes a charge storage structure, such as a floating gate (FG) or charge trap (CT), that is insulated by an oxide or other dielectric. The charge storage structure is located between the CG and semiconductor material and stores electrons or holes placed on it. Information is represented by the amount of stored electrons or holes.

A NAND array architecture is an array of memory cells arranged such that the memory cells of the array are coupled in logical rows to access lines (which are coupled to, and in some cases are at least partially formed by, the CGs of the memory cells), which are conventionally referred to as word lines. Some memory cells of the array are coupled together in series, source to drain, between a source line and the data line, which is conventionally referred to as a bit line.

Memory cells in NAND array architecture can be programmed to a desired data state. For example, electric charge can be accumulated (e.g., placed) on, or removed from, a floating gate of a memory cell to program the cell into a desired one of a number of data states. For example, a memory cell conventionally referred to as a single level cell (SLC) can be programmed to a desired one of two data states, e.g., a "1" or a "0" state. Memory cells conventionally referred to as multilevel cells (MLCs) can be programmed to a desired one of more than two data states.

When electrons are stored on the FG, they modify the threshold voltage (Vt) of the cell. Thus, when the cell is "read" by placing a specific voltage on the CG (e.g., by driving the access line coupled to the cell with a read voltage), electrical current will either flow or not flow between the cell's source and drain connections, depending on the Vt of the cell. This presence or absence of current can be sensed and translated into 1's and 0's, reproducing the stored data.

Each memory cell may not directly couple to a source line and a data line. Instead, the memory cells of an example array may be arranged together in strings, typically of 8, 16, 32, or more strings each, where the memory cells in the string are coupled together in series, source to drain, between a common source line and a data line.

A NAND architecture floating gate memory array is accessed by a row decoder activating a row of floating gate memory cells by driving the access line coupled to those cells with a voltage. In addition, the access lines coupled to the unselected memory cells of each string are also driven with a different voltage. For example, the unselected memory cells of each string may be driven with a pass voltage so as to operate them as pass transistors, allowing them to pass current in a manner that is unrestricted by their programmed data states. Current then flows from the source line to the data line through each floating gate memory cell of the series coupled string, restricted by the memory cell of each string that is selected to be read. This places the current encoded stored data values of the row of selected memory cells on the column bit lines. A column page of data lines is selected and sensed, and then individual data words are selected from the sensed data words from the column page and communicated from the memory apparatus.

Various embodiments disclosed herein may operate to control the potential on a body semiconductor of an apparatus. The potential of the body semiconductor may be controlled by using a pillar body connection to the body semiconductor. In some embodiments, the apparatus may comprise a memory apparatus. In some embodiments, the apparatus may comprise a VNAND memory.

Memory apparatuses without body connections operate with a floating body semiconductor potential. Problems associated with a floating body semiconductor potential may include fluctuating threshold voltage (Vt) and fewer potential data states to be stored in a single cell. By including a pillar body connection in a VNAND memory the charge accumulation on the body semiconductor may be more easily controlled. Improved control may help reduce issues associated with a fluctuating Vt that may be caused by the floating body potential. Also, controlling the amount of charge on the body semiconductor may increase the number of potential data states that can be stored in a single cell when compared to the number of potential data states that would otherwise be available without controlling the amount of charge stored on the body semiconductor. Accordingly, controlling the body potential may also increase the density (e.g. by increasing the number of bits per cell) of the memory without scaling the minimum feature size of the memory.

Improved control may also allow for more accurate writes to and reads from a memory. By placing charge on or removing charge from the body semiconductor before performing a read or write operation the amount of charge on the body semiconductor may be known, and the difference in potential from the body to the control gate may be more accurately determined.

FIG. 1A illustrates, generally, an apparatus 100A according to an example embodiment. Apparatus 100A may include a memory array and a body semiconductor. The apparatus 100A may include one or more body connections that are connected to the body semiconductor. The memory array may include a vertical memory access line stack. The memory array may further include charge blocking dielectrics, charge storage structures, tunneling insulators, and data line pillars. The body connections may include body pillars and/or body contacts (e.g., body lines). The memory array may have a vertical, three-dimensional architecture over devices on the substrate. Thus, for an embodiment, devices may be formed on a substrate and the body semiconductor may be formed over the devices and the substrate, and the vertical memory access line stack may be formed over the body semiconductor. Further details regarding each of these elements will now be presented.

Figure 1B:
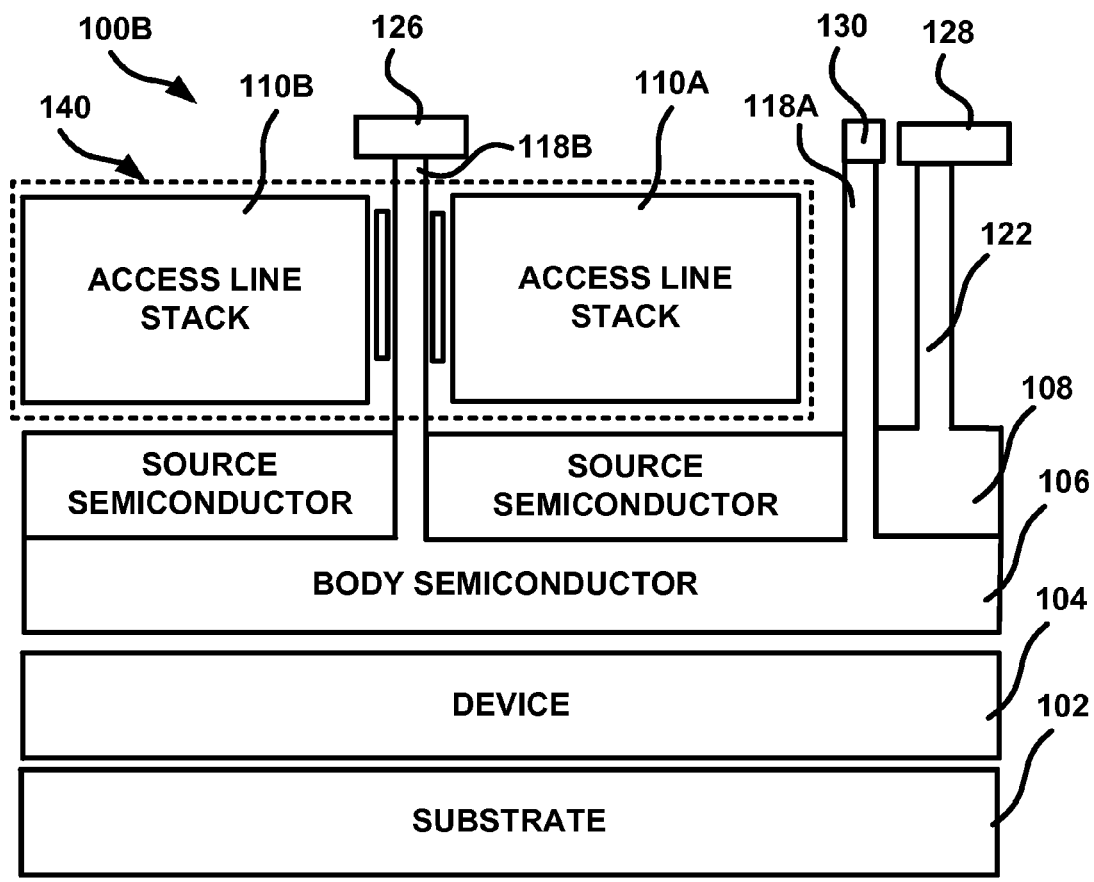
FIG. 1B illustrates, generally, a block diagram of an apparatus according to an example embodiment.
Figure 1C:
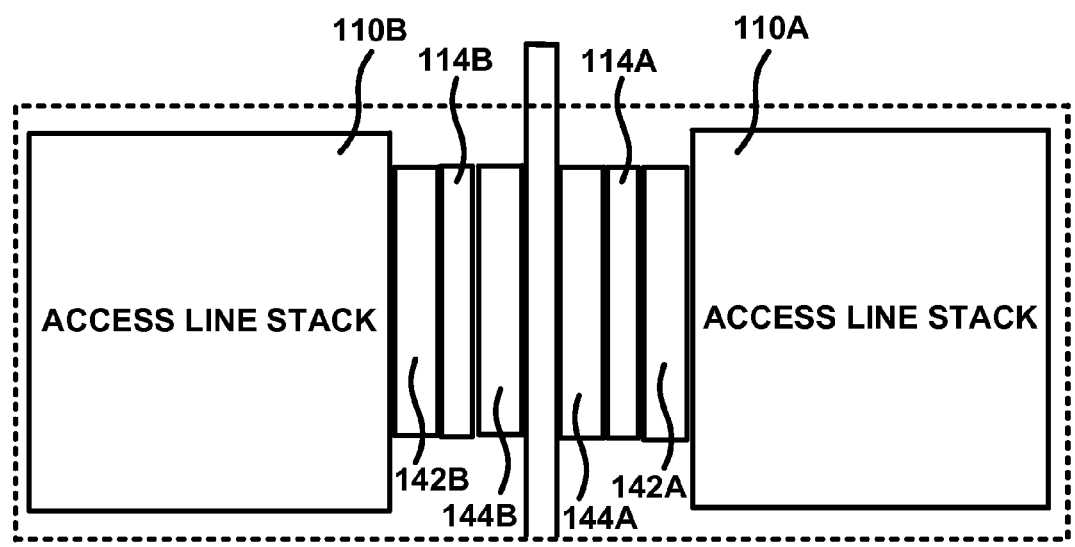
FIG. 1C is an exploded view block diagram of a memory array of FIG. 1B according to an example embodiment.

FIG. 1B illustrates, generally, an apparatus 100B according to an example embodiment. Apparatus 100B may include a substrate 102, at least one device 104, a body semiconductor 106, a source semiconductor 108, memory access line stacks 110A, 110B, a body pillar 118A, a body contact 130, charge storage structures 114A, 114B, (see FIG. 1C), tunneling insulators 144A, 144B (see FIG. 1C), charge blocking dielectrics 142A, 142B (seem FIG. 1C), a data line pillar 118B, a data line contact (e.g., a data line) 126, a source pillar 122, and a source contact (e.g., a source line) 128. The tunneling insulators 144A, 144B, which may comprise tunnel oxide, may be located between the data line pillar 118B and the memory access line stack. The memory access line stack 110A, 110B, may have vertical memory architecture over the device(s) 104. The dashed lines indicate the boundaries of a memory array 140, according to an example embodiment. The memory array 140 may include a plurality of memory access line stacks, semiconductor pillars, charge storage structures, charge blocking dielectrics, and tunnel oxides, among others.

The substrate 102 may comprise an n-type substrate, p-type substrate, or a combination thereof. In some embodiments, the at least one device 104 may comprise a transistor. The device(s) may include, by way of example and not limitation, CMOS devices, field effect transistors (FETs), bipolar transistors, or other types of transistors. In some embodiments, the at least one device 104 is formed on, or at least partially in, substrate 102.

The body semiconductor 106 may be formed over the at least one device 104 and substrate 102, and may be separated from the device(s) by an oxide or other type of insulator. The body semiconductor 106 may comprise a p-type or n-type semiconductor, such as a layer of doped polysilicon or a region of the substrate 102 doped to be the body semiconductor 108.

The source semiconductor 108 may be formed over (e.g., on) the body semiconductor 106, and may also comprise a layer of doped polysilicon or a region of the substrate 102 doped to be the source semiconductor 108. The source semiconductor 108 may be doped oppositely of the body semiconductor 106. In some embodiments, the source semiconductor 108 is an n-type semiconductor and the body semiconductor 106 is a p-type semiconductor. In some embodiments, the source semiconductor 108 is a p-type semiconductor and the body semiconductor 106 is an n-type semiconductor.

The memory access line stack 110A or 110B may be formed over the source semiconductor 108. In some embodiments, the memory access line stacks 110A and 110B and source semiconductor 108 are separated by an oxide insulator or other type of insulator. In some embodiments, the memory access line stacks 110A, 110B may be associated with a volatile memory or a non-volatile memory. For example, the memory access line stacks 110A and 110B may be associated with a dynamic random access memory (DRAM), static random access memory (SRAM), a phase change memory, a resistive memory, or other type of memory. In some embodiments, memory access line stack 110A or 110B may be associated with a vertical memory apparatus. In some embodiments, memory access line stack 110A or 110B is a VNAND memory stack.

A semiconductor pillar 118A or 118B may be formed in the apparatus 100B. In some embodiments, the semiconductor pillar 118A or 118B may extend through the memory access line stack 110A or 110B and the source semiconductor 108 to the body semiconductor 106. In some embodiments, the semiconductor pillar 118A or 118B is formed in an opening in the source semiconductor 108 at an edge of or outside a footprint of the memory access line stack 110A or 110B. In some embodiments, semiconductor pillar 118A is a body pillar and semiconductor pillar 118B is a data line pillar. Including the semiconductor pillar 118A may allow a controller, such as a processor (e.g., including a computer processor), to control the amount of charge stored on the body semiconductor 106. Including the body pillar may help reduce problems associated with operating an apparatus with a floating body potential. By creating a connection to the body semiconductor 106, as described herein, the Vt of a single memory cell may be more accurately controlled. Controlling the Vt may allow storing more bits per cell in a memory apparatus, and also may allow for more accurate read and write operations. For embodiment, more accurate read and write operations, and more bits per memory cell, may be attained by grounding the semiconductor pillar 118A, thus grounding the body semiconductor 106, before performing a read or write operation.

FIGS. 2-10 illustrate an embodiment process for making an apparatus with a pillar body connection. In the illustrated embodiment of FIGS. 2-10 a semiconductor pillar connected to the body is not electrically isolated from a source semiconductor.

Figure 2:
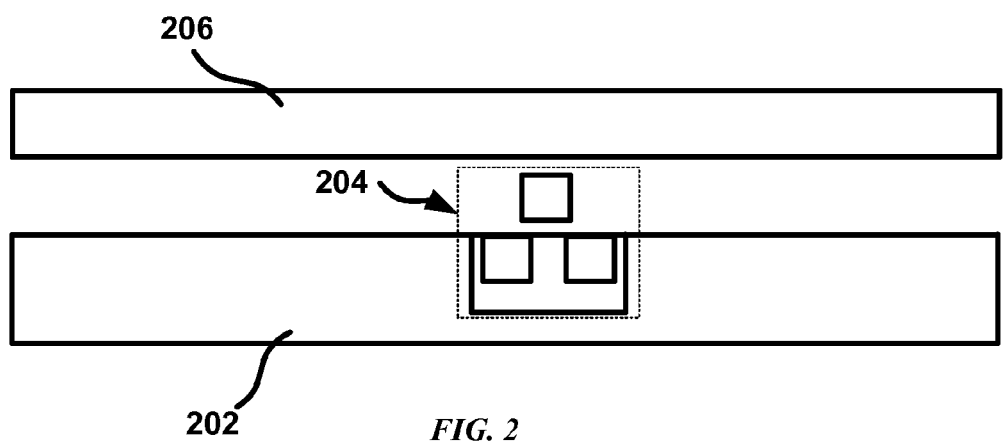
FIGS. 2-10 illustrate, generally, a process for fabricating an apparatus with a pillar body connection according to an example embodiment.

FIG. 2 illustrates a substrate 202 with a body semiconductor 206 formed over the substrate 202. In some embodiments, the substrate 202 is a p-type or n-type silicon substrate. In some embodiments, at least one device 204 is included on, or at least partially in, substrate 202. In some embodiments, device 204 is a transistor. In some embodiments, the device includes a CMOS device. The body semiconductor 206 may be of a first dopant type. In some embodiments, the dopants of the first type may be p-type or n-type polysilicon dopants.

Figure 3:
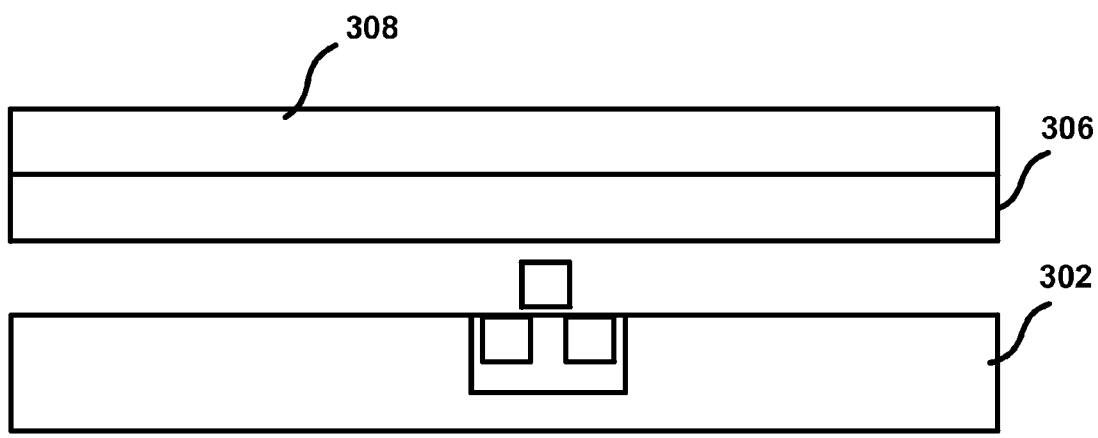

FIG. 3 illustrates a substrate 302 and a body semiconductor 306 with a source semiconductor 308 formed over the body semiconductor 306. The substrate 302 and body semiconductor 306 may be substantially similar to those corresponding items of FIG. 2. The source semiconductor may be of a second dopant type. In some embodiments, the dopants of the second type may be p-type or n-type polysilicon dopants.

Figure 4:
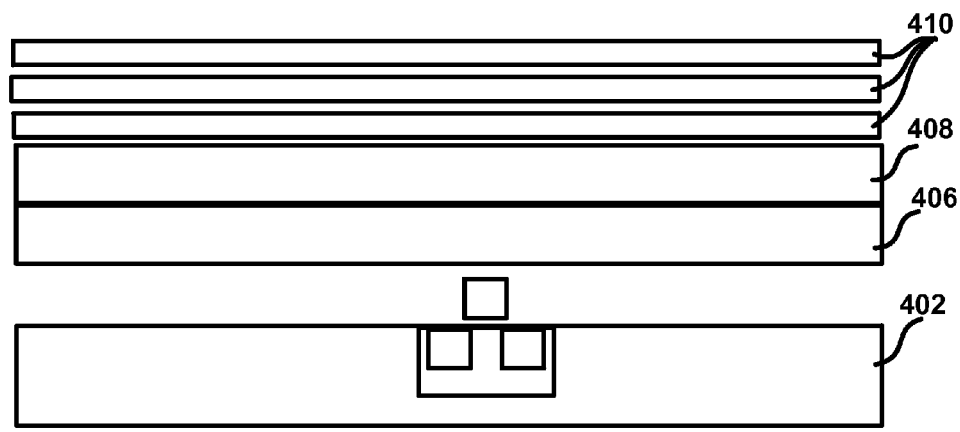

FIG. 4 illustrates a substrate 402, body semiconductor 406, and source semiconductor 408 with a memory access line stack formed over the source semiconductor 408. The substrate 402, body semiconductor 406, and source semiconductor 408 may be substantially similar to those corresponding items of FIG. 3. In some embodiments, the memory access line stack comprises a VNAND memory stack. In other embodiments the memory stack is a phase change, a resistive or other semiconductor memory stack.

Figure 5:
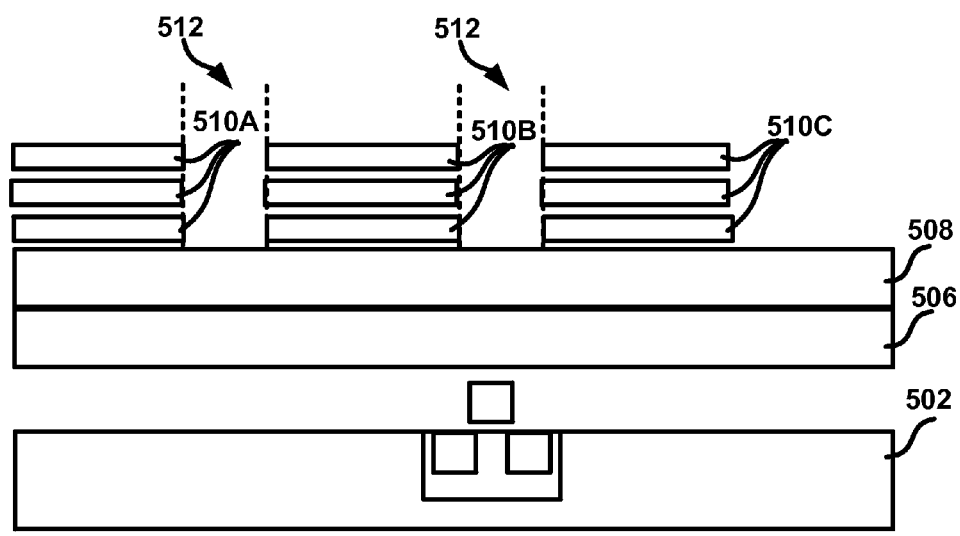

FIG. 5 illustrates an apparatus substantially similar to the apparatus of FIG. 4, with at least one opening 512 formed in memory access line stack 410. In the illustrated embodiment two openings in memory access line stack 410 have been formed to create memory access line stacks such as the illustrated memory access line stacks 510A, 510B, and 510C. The disclosure herein is not limited to three memory access line stacks, as a different number of memory access line stacks may be formed. The at least one opening 512 in memory access line stack 410 may be formed through an etching, drilling, or other process of forming the at least one opening in the memory access line stack 410. Adjacent memory access line stacks 510A and 510B or 510B and 510C, may be separated by a gap. The edges of the gap are indicated by vertical dashed lines.

Figure 6:
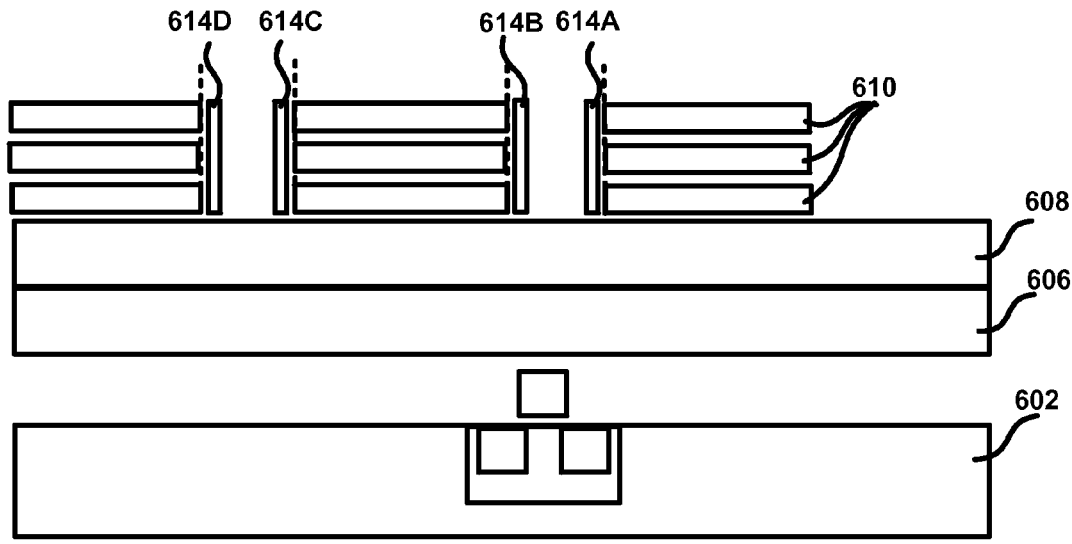

FIG. 6 illustrates an apparatus substantially similar to the apparatus of FIG. 5 with charge storage structures 614A, 614B, 614C, and 614D formed in the gaps between adjacent memory access line stacks. The charge storage structure 614A, 614B, 614C, or 614D may be separated from the memory access line stack by a charge blocking dielectric (see, for example, charge blocking dielectrics 142A, 142B of FIG. 1C).

Figure 7:
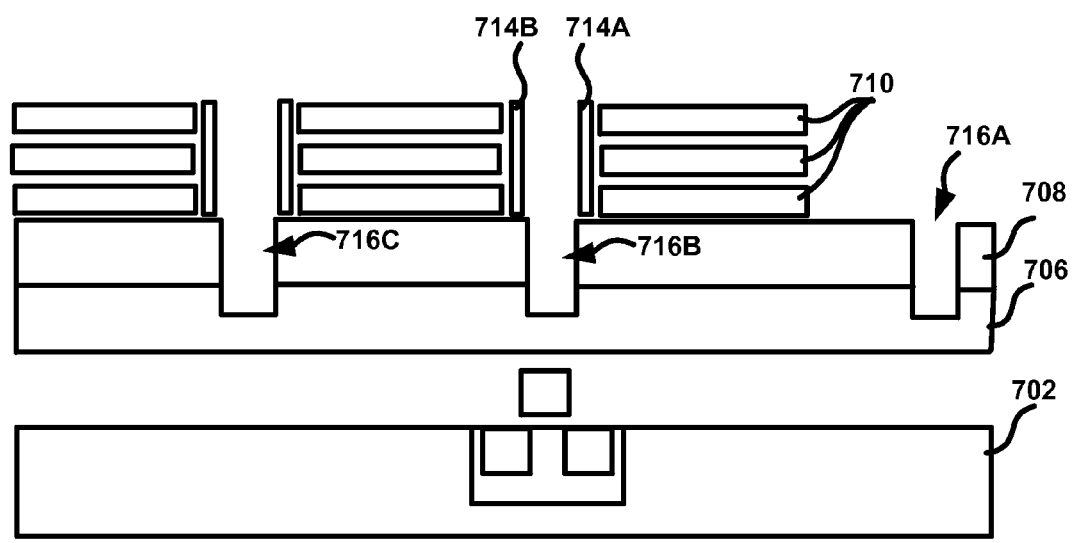

FIG. 7 illustrates an apparatus substantially similar to the apparatus of FIG. 6 with source semiconductor opening 716A, 716B, or 716C formed in the source semiconductor 708. A source semiconductor opening 716A, 716B, or 716C may extend all the way through the source semiconductor 708 to body semiconductor 706. In some embodiments, a source semiconductor opening 716A, 716B, 716C may extend, at least partially, into the body semiconductor 706. In some embodiments, source semiconductor openings 716A, 716B, 716C, may be filled with semiconductor material to create semiconductor pillars. In some embodiments, source semiconductor openings 716B and 716C may be filled with material (e.g., polysilicon) to create data line pillars. In some embodiments, source semiconductor opening 716A may be filled with material (e.g., polysilicon) to create a body pillar.

Figure 8:
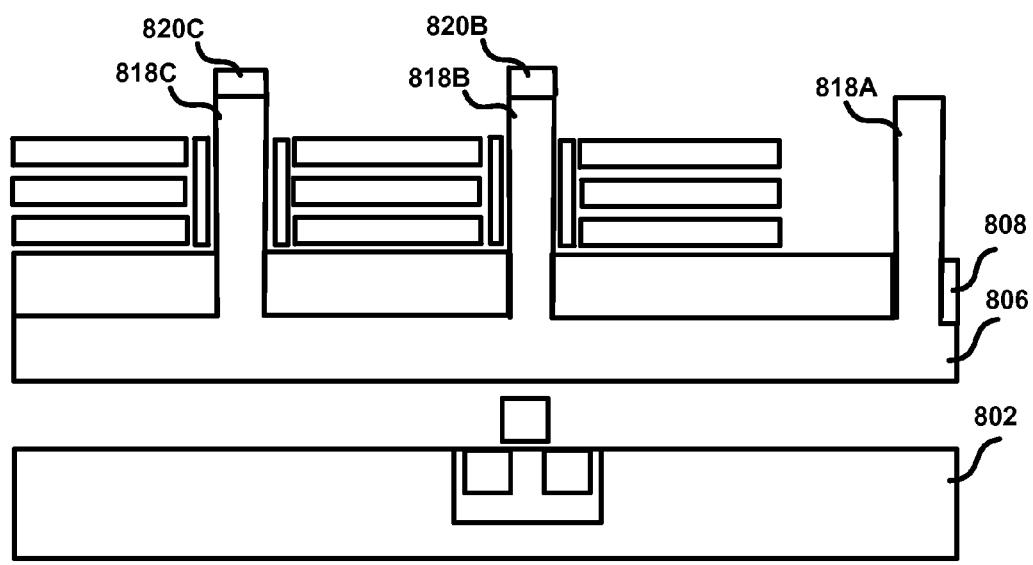

FIG. 8 illustrates an apparatus substantially similar to the apparatus of FIG. 7 with semiconductor pillars 818A, 818B, or 818C formed in each source semiconductor opening 716A, 716B, and 716C (see FIG. 7), respectively. In some embodiments, the semiconductor pillar 818A, 818B, or 818C extends through a memory access line stack (not labeled in FIG. 8) through source semiconductor 808, to body semiconductor 806. In some embodiments, semiconductor pillar 818A is a body pillar. In some embodiments, the body pillar allows a controller to control the amount of charge stored on the body semiconductor 806. In some embodiments, semiconductor pillars 818B and 818C are data line pillars. In some embodiments, dopants may be diffused or implanted into at least one of the semiconductor pillars 818A, 818B, or 818C. For example, semiconductor pillar 818A, 818B, or 818C may be doped with a dopant(s) of a first dopant type. In some embodiments, the dopants may be of a second dopant type. In some embodiments, n-type dopants are diffused or implanted into a portion of semiconductor pillars 818B and 818C, such that portions 820B and 820C of semiconductor pillars 818B and 818C are doped differently than remaining portions of those pillars. Adjacent memory access line stacks (not labeled in FIG. 8) may be separated by at least one charge storage structure (not labeled in FIG. 8), tunnel oxide (not labeled in FIG. 8), and a data line pillar 818B or 818C.

Figure 9:
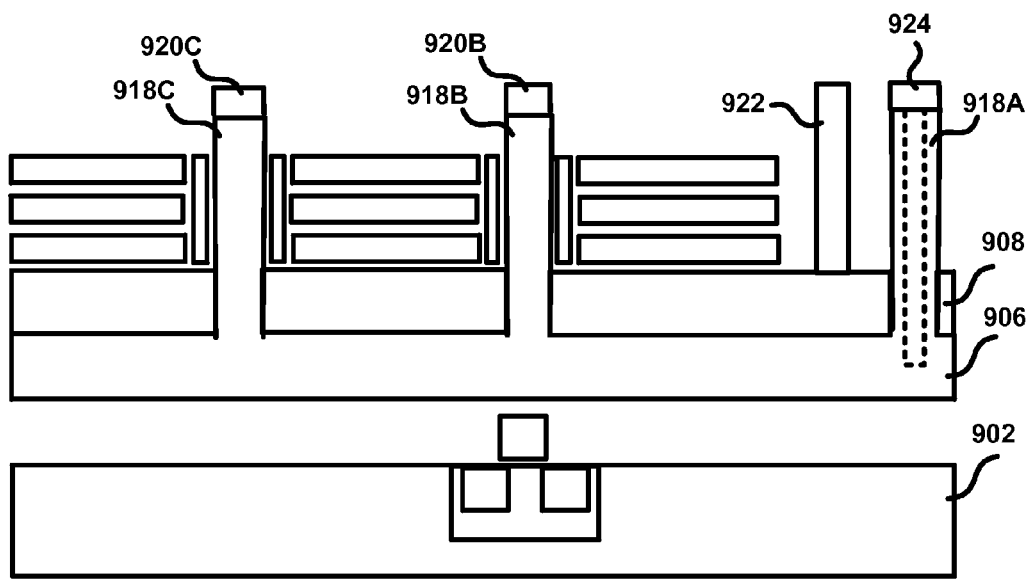

FIG. 9 illustrates an apparatus substantially similar to the apparatus of FIG. 8 with conductive material formed into or on the apparatus to create a source pillar 922 and a first body contact 924 that connects to the body semiconductor 906 through body pillar 918A. The source semiconductor 922 may be located at an edge of or outside a footprint of the memory access line stack (not labeled in FIG. 9). Dashed lines in semiconductor pillar 918A indicate that the conductive material may, at least partially, penetrate the semiconductor pillar 918A and may extend at least to the body semiconductor 906.

Figure 10:
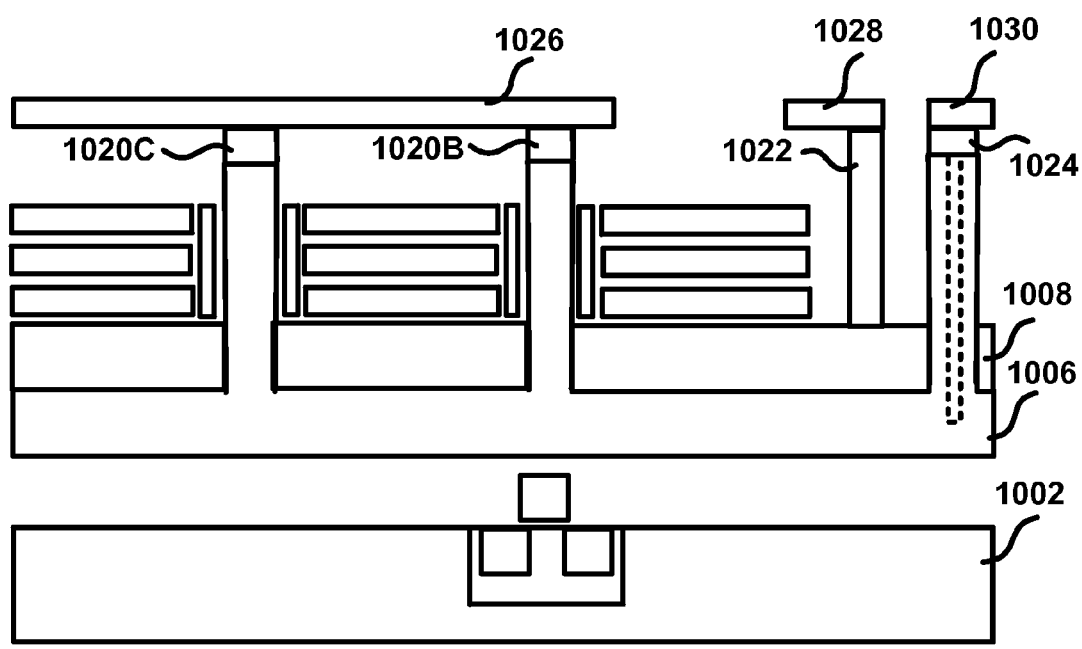

FIG. 10 illustrates an apparatus substantially similar to the apparatus of FIG. 9 with at least one data line contact (e.g., a data line) 1026 connected to portions 1020B and 1020C, at least one source contact (e.g., source line) 1028 connected to source pillar 1022, and at least one second body contact (e.g., body line) 1030 connected to the first body contact 1024. The data line contact 1026, source contact 1028, and second body contact 1030 may include conductive material such as metal, semiconductor, or a combination thereof. The second body contact 1030 may be coupled to body semiconductor 106 through the first body contact 1024 and the body pillar.

In some embodiments, the combination of second body contact 1030, first body contact 1024 and body pillar may be operable to allow a controller, such as a processor, to control an amount of charge stored on body semiconductor 1006. In some embodiments, the controller may operate to control the amount of charge stored on source semiconductor 1008 through the combination of the source contact 1028 and the source pillar 1022. In some embodiments, the accuracy of read and write operations to a memory may improve by connecting the second body contact 1030 to ground before a read or write operation is performed. The body semiconductor 1006 may be connected to ground by connecting the body contact 1030 to ground.

FIGS. 11-14 illustrate, generally, a method of making an apparatus with at least one body pillar that is electrically isolated from a source semiconductor. In some embodiments, data line pillars may be electrically isolated from a source semiconductor. The beginning of the method may be substantially similar to the method of making an apparatus with a pillar body connection that is not electrically isolated from a source semiconductor as depicted in FIGS. 2-4.

Figure 11:
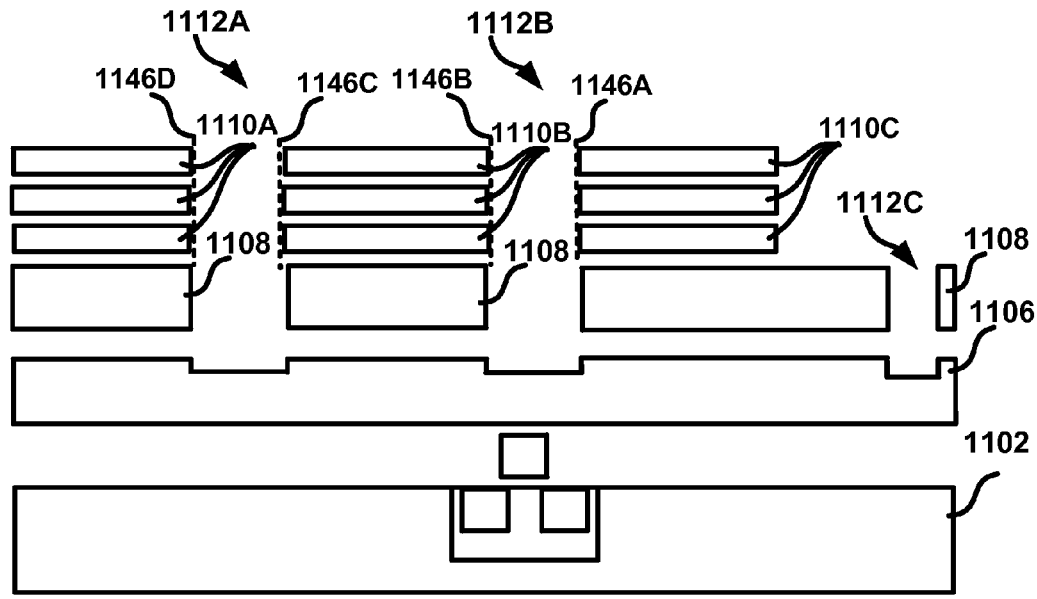
FIGS. 11-14 illustrate, generally, another process for fabricating an apparatus with a pillar body connection according to an example embodiment.

FIG. 11 illustrates an apparatus substantially similar to the apparatus of FIG. 4, with semiconductor openings 1112A, 1112B, or 1112C formed in the apparatus of FIG. 11. Semiconductor openings 1112A, 1112B, and 1112C may extend from the memory access line stack 410 through the source semiconductor 1108 to the body semiconductor 1106. In the illustrated embodiment, semiconductor openings 1112A and 1112B extend from at least a top surface of a memory access line stack 1110A, 1110B, or 1110C through the source semiconductor 1108 to body semiconductor 1106. In the illustrated embodiment, two semiconductor openings 1112A and 1112B in memory access line stack 410 have been formed to create three separate memory access line stacks 1110A, 1110B, and 1110C. The semiconductor openings 1112A, 1112B, or 1112C may be formed through an etching, drilling, or other process. Semiconductor opening 1112C may be formed at an edge of or outside a footprint of a memory access line stack. In the illustrated embodiment, semiconductor opening 1112C extends through the source semiconductor 1108 to at least a top surface of the body semiconductor 1106.

In some embodiments, semiconductor opening 1112A, 1112B, or 1112C may extend at least partially into body semiconductor 1106.

Adjacent memory access line stacks 1110A and 1110B or 1110B and 1110C, may be separated by a gap. The edges of the gap are indicated by vertical dashed lines 1146A, 1146B, 1146C, 1146D. The edges of the gap 1146A, 1146B, 1146C, 1146D may correspond with sides of a semiconductor opening.

Figure 12:
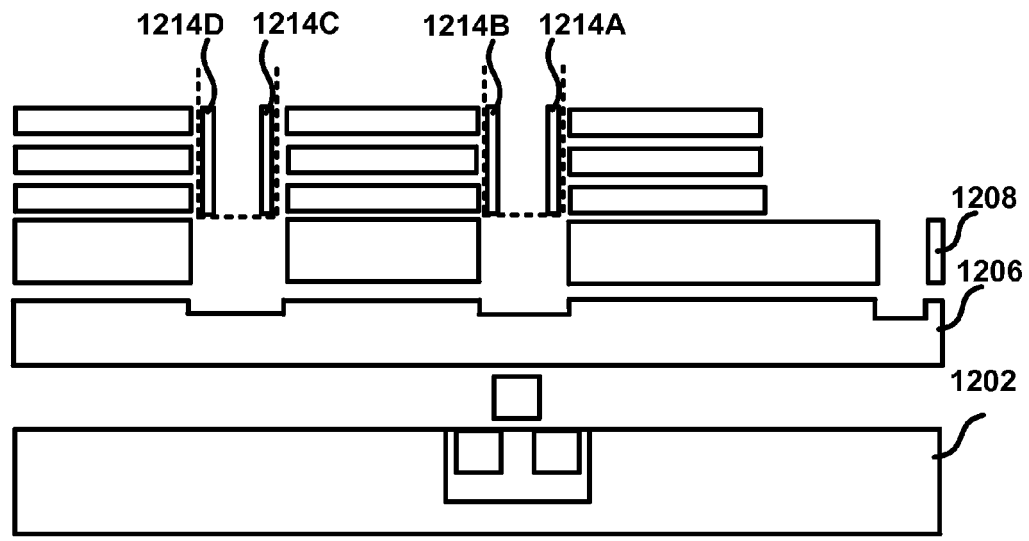

FIG. 12 illustrates an apparatus substantially similar to the apparatus of FIG. 11 with at least one charge storage structure 1214A, 1214B, 1214C, or 1214D formed in a gap between memory access line stacks. In some embodiments, the at least one charge storage structure 1214A, 1214B, 1214C, or 1214D may be formed by filling a gap with an insulator such as an oxide and then forming an opening in the insulator such as the opening illustrated by the dashed lines. After the opening in the insulator has been formed then the charge storage structure may be formed in the opening. The at least one charge storage structure 1214A, 1214B, 1214C, or 1214D may be separated from the memory access line stack by an insulator such as a charge blocking dielectric.

Figure 13:
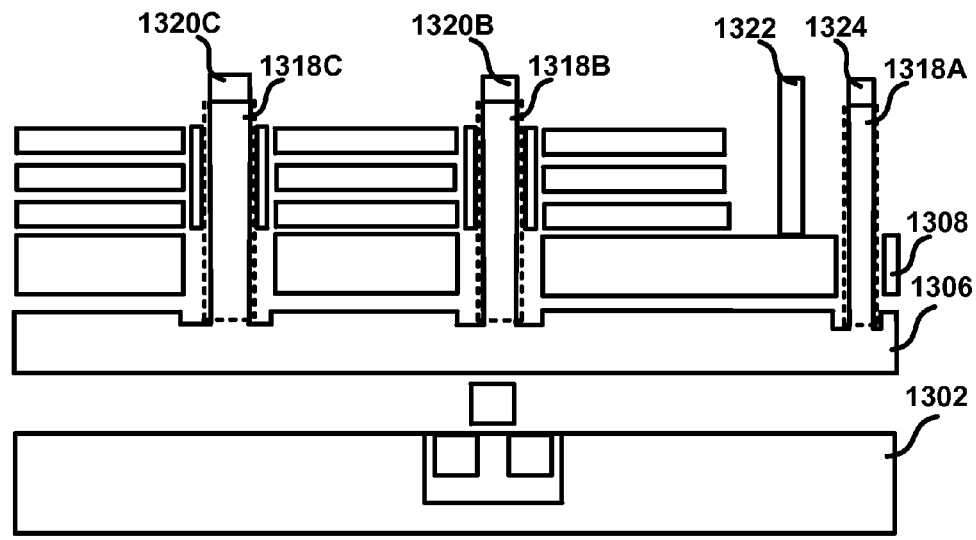

FIG. 13 illustrates an apparatus substantially similar to the apparatus of FIG. 12 with a semiconductor pillar 1318A, 1318B, or 1318C formed in each semiconductor opening 1112A, 1112B, and 1112C; dopants have been diffused or implanted onto, or at least partially in, portions 1320B and 1320C of semiconductor pillars 1318B and 1318C; and conductive material has been formed on, or at least partially in, the apparatus to create a source pillar 1322 that connects to the source semiconductor 1308 and a first body contact 1324 that connects to the body semiconductor 1306 (e.g., through body pillar 1318A).

In some embodiments, a semiconductor pillar 1318A, 1318B, or 1318C may be formed by drilling or etching a source semiconductor opening such as an opening similar to the source semiconductor opening 716A, 716B, or 716C of FIG. 7 and forming semiconductor material (e.g., conductively doped polysilicon) into the source semiconductor openings. In some embodiments, semiconductor pillar 1318A, 1318B, or 1318C includes n-type or p-type material. In some embodiments, the semiconductor pillar 1318A, 1318B, or 1318C extends from a memory access line stack (not labeled in FIG. 13) through source semiconductor 1308, to body semiconductor 1306. In some embodiments, semiconductor pillar 1318A is a body pillar. In some embodiments, the body pillar allows a controller to control the amount of charge stored on the body semiconductor 1306. In some embodiments, semiconductor pillars 1318B and 1318C are data line pillars. In some embodiments, dopants may be diffused or implanted into at least one of the semiconductor pillars 1318A, 1318B, or 1318C. In some embodiments, the dopants may be p-type or n-type dopants. In the illustrated embodiment, n-type dopants are diffused or implanted on or at least partially into portions 1320B and 1320C of semiconductor pillars 1318B and 1318C, respectively. Adjacent memory access line stacks (not labeled in FIG. 13) may be separated by at least one charge storage structure (not labeled in FIG. 13), tunnel oxide (not labeled in FIG. 13), and a data line pillar 1318B or 1318C.

Figure 14:
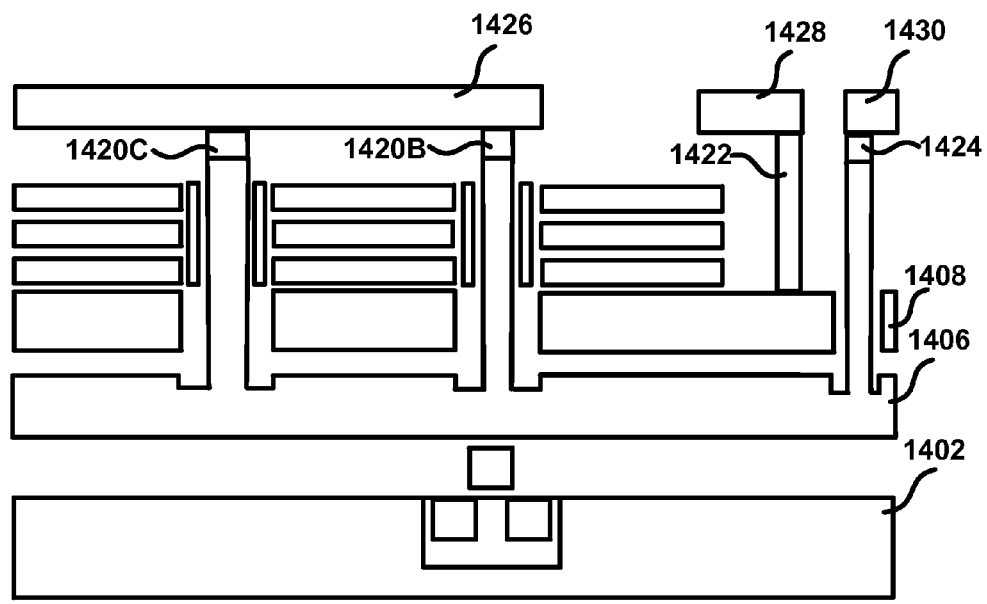

FIG. 14 illustrates an apparatus substantially similar to the apparatus of FIG. 13 with at least one data line contact 1426 connected to doped portions 1420B and 1420C; at least one source contact 1428 has been connected to source pillar 1422; and at least one second body contact 1430 has been connected to first body contact 1424. The data line contact 1426, source contact 1428, and second body contact 1430 may include conductive material such as metal, semiconductor, or a combination thereof. In some embodiments, a body connection comprising the second body contact 1430, first body contact 1424 and body pillar may be operable to allow a controller, such as a user or processor, to control an amount of charge stored on body semiconductor 1406. In some embodiments, a controller may operate to control the amount of charge stored on source semiconductor 1408 through the source contact 1428. In some embodiments, read and write operations to a memory may be more accurate by connecting the body semiconductor 1406 to ground before performing a read or write operation.

Figure 15:
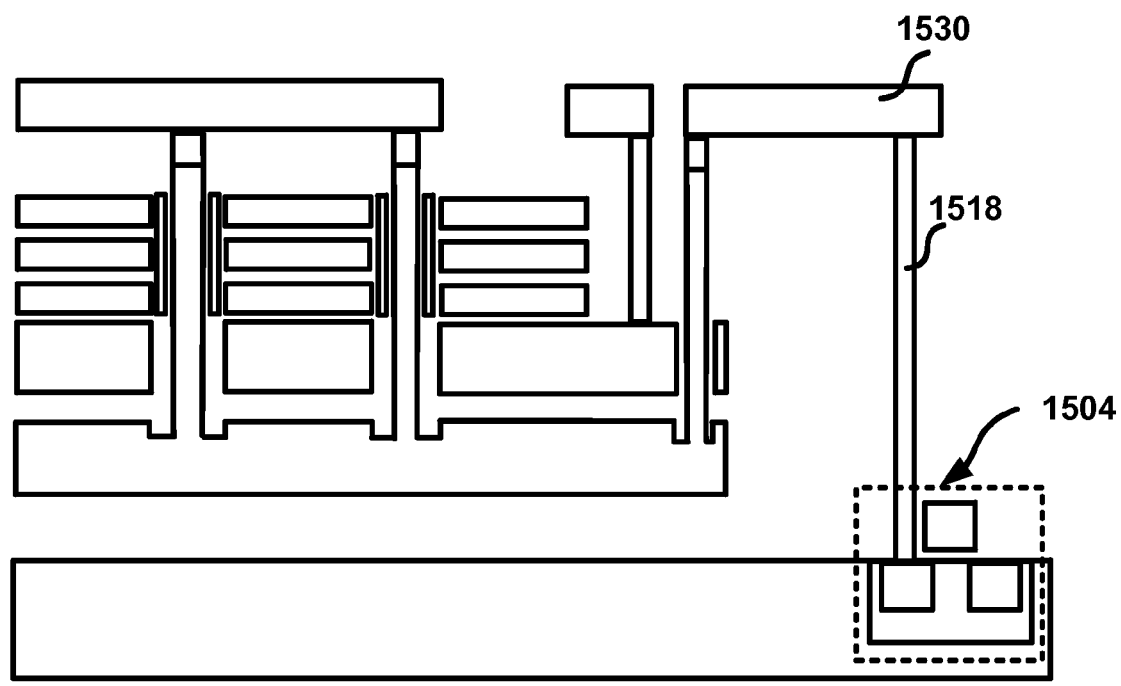
FIG. 15 illustrates, generally, an apparatus according to an example embodiment.

FIG. 15 illustrates an apparatus, according to an example embodiment. The apparatus of FIG. 15 may be substantially similar to the apparatus of FIG. 10 or 13 with the device 1504 at an edge of or outside a footprint of the memory access line stack. In some embodiments, the device 1504 may be electrically coupled to the body semiconductor of the apparatus through a body connection. In the illustrated embodiment, the body connection comprises a first body contact 1530 and a semiconductor pillar 1518. In some embodiments, the semiconductor pillar 1518 may be coupled to the first body contact 1530 through a second body contact such as second body contact 1424 of FIG. 14.

Figure 16:
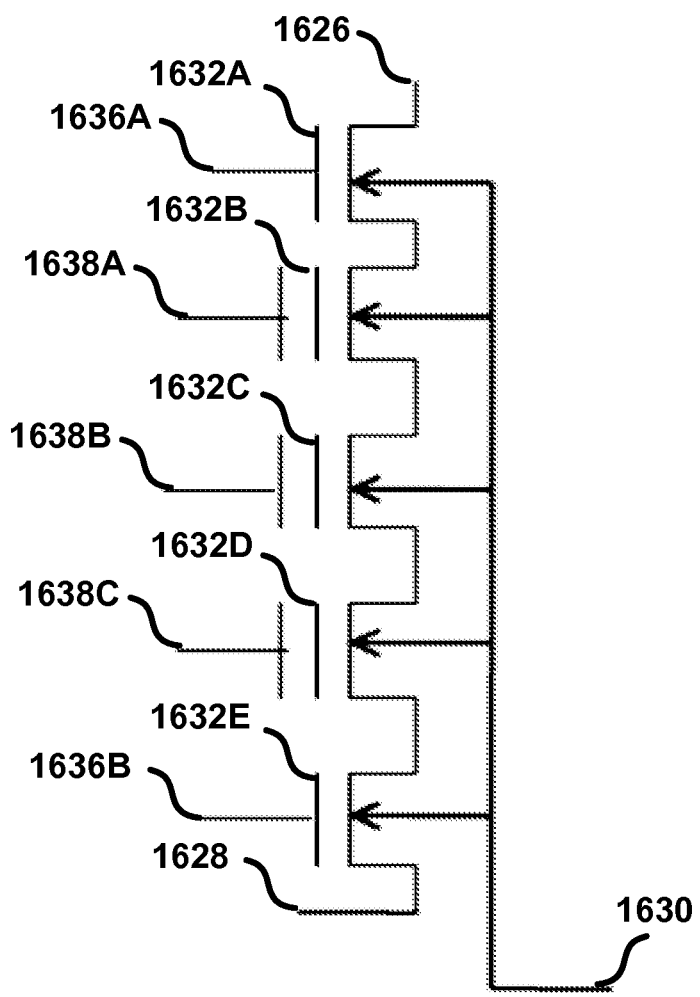
FIG. 16 illustrates, generally, a circuit diagram of an apparatus made according to an example embodiment.

FIG. 16 is a circuit diagram illustration of an apparatus made according to an example embodiment. The circuit diagram depicts five transistors 1632A, 1632B, 1632C, 1632D, and 1632E. Transistor 1632A may be a control transistor. Transistor 1632A may be connected to a data line contact 1626, select line 1636A, and body contact 1630. Transistor 1632A may be connected to transistor 1632B. Transistor 1632B may be a memory cell transistor. Transistor 1632B may be connected to access line 1638A, body contact 1630, and transistor 1632C. Transistor 1632C may be a memory cell transistor. Transistor 1632C may be connected to access line 1638B, body contact 1630, and transistor 1632D. Transistor 1632D may be a memory cell transistor. Transistor 1632D may be connected to access line 1638C, body contact 1630, and transistor 1632E. Transistor 1632E may be a control transistor. Transistor 1632E may be connected to select line 1636B, source contact 1628, and body contact 1630. Other embodiments may be realized.

Figure 17:
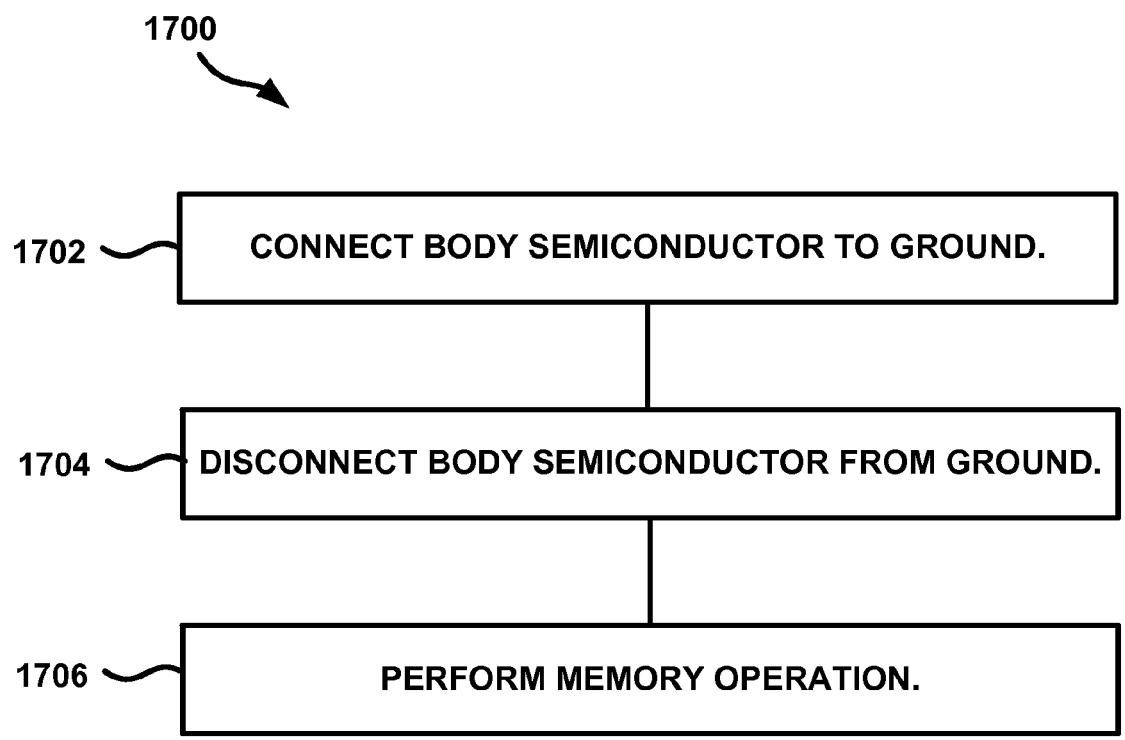
FIG. 17 illustrates, generally, a method of performing a memory operation according to an example embodiment.

FIG. 17 is a block diagram illustration of a method of performing a memory operation 1700 according to an example embodiment. The method of performing a memory operation 1700 may include connecting a body semiconductor to ground 1702. The body semiconductor may be connected to ground by directly connecting a body contact to ground. The body contact may be connected to a body connection that may be connected to a body pillar that may be connected to the body semiconductor. Thus, the body semiconductor may be connected to ground by connecting the body to ground. The body semiconductor may be disconnected from ground 1704. This may be accomplished by opening or closing a switch coupled between the body contact and ground, or some other way of disconnecting the body semiconductor from ground. A memory operation may be performed 1706. The memory operation may be a memory read or a memory write operation. The memory write operation may include tunnel injection. Tunnel injection is a process whereby charge carriers (holes or electrons) are injected onto the charge storage structure through an insulator.

Figure 18:
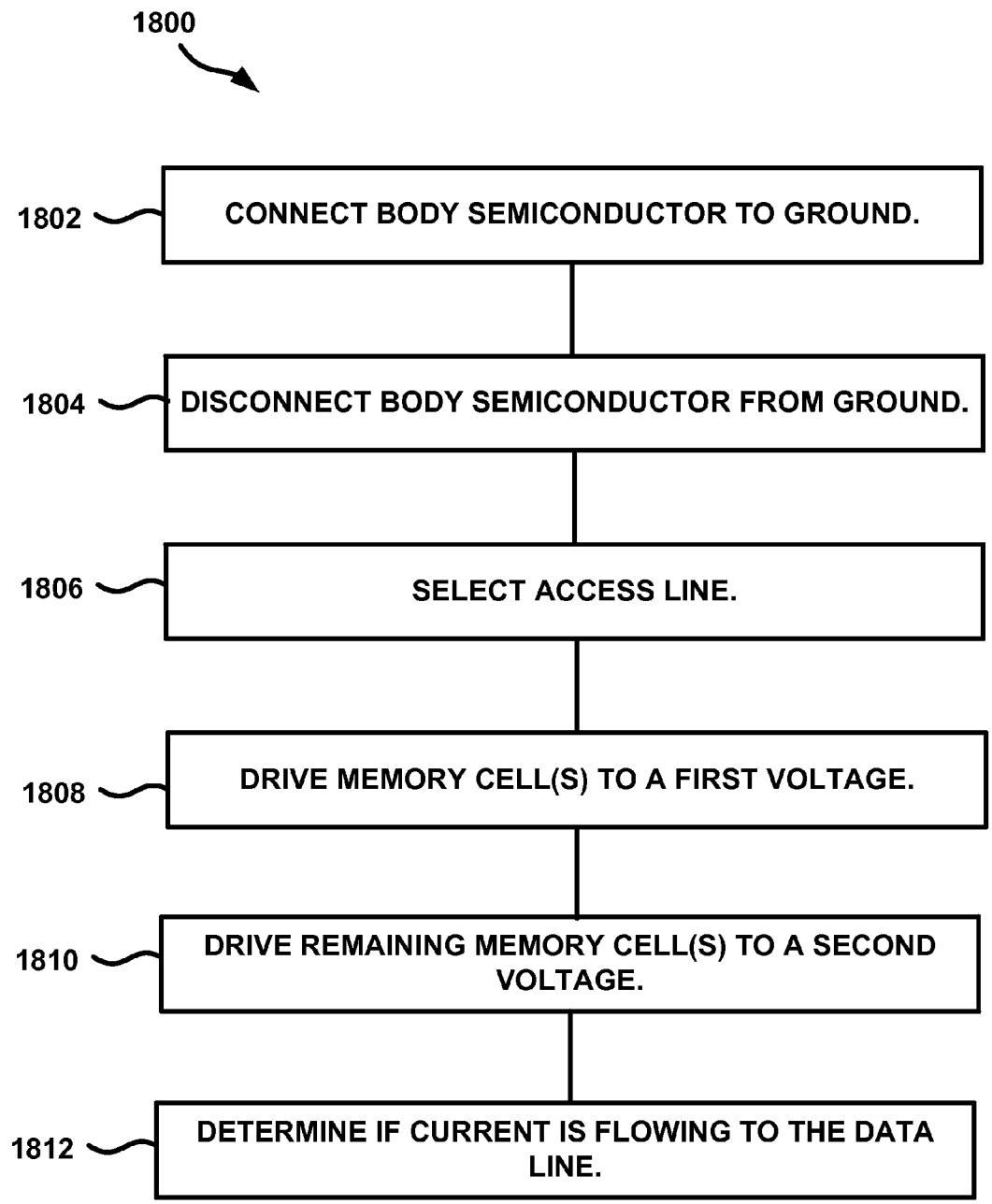
FIG. 18 illustrates, generally, a method of performing a read operation according to an example embodiment.

FIG. 18 is a block diagram illustration of a method of performing a read operation 1800 according to an example embodiment. The method of performing a read operation 1800 may include connecting a body semiconductor to ground 1802. Connecting a body semiconductor to ground 1802 may be substantially similar to connecting the body semiconductor to ground 1602. Disconnecting the body semiconductor from ground 1804 may be substantially the same as disconnecting the body semiconductor from ground 1604. An access line may be selected 1806. The access line may be connected to a selected memory cell of a vertical string (e.g., a respective selected memory cell in each of a plurality of strings) of memory cells.

Unselected memory cells of the vertical string may be driven with a pass voltage 1808. The pass voltage may be higher than a memory cell threshold voltage of a programmed bit. In some embodiments, all but one memory cell of the vertical string is driven with the pass voltage.

The selected memory cell (e.g., the control gate of the selected memory cell) of the vertical string may be driven with a read voltage 1810. The read voltage may be less than the pass voltage. The memory cell(s) may be read by determining if current is flowing to the data line 1812. In some embodiments, the read voltage may be stepped up or down to read the selected memory cell. For example, if the memory cell can be programmed to a desired one of more than two data states, then the read voltage may be driven with different voltages to read the memory cell.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is therefore intended to cover adaptations or variations of the present subject matter.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Thus, the above description is intended to be illustrative, and not restrictive. For embodiment, the above-described examples and embodiments (or one or more aspects thereof) may be used in combination with each other. Other embodiments can be used such as by one of ordinary skill in the art upon reviewing the above description. The Abstract is provided to comply with 37 C.F.R. §1.72(b), to allow the reader to quickly assume the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of performing a read operation on a memory, the memory including a plurality of vertical strings of memory cells over a body semiconductor, the body semiconductor connected to a body pillar, the method comprising:
coupling the body semiconductor to ground by connecting the body pillar to ground;
uncoupling the body semiconductor from ground; and
reading the contents of a selected memory cell of a selected vertical string of memory cells of the plurality of vertical strings of memory cells.

2. The method of claim 1, wherein the read operation comprises:
selecting an access line electrically coupled to the selected vertical string of memory cells of the multiple vertical strings of memory cells.

3. The method of claim 1, wherein the read operation comprises:
driving an unselected memory cell of the selected vertical string of memory cells with a pass voltage.

4. The method of claim 3, wherein the read operation comprises:
driving the selected memory cell with a read voltage lower than the pass voltage.

5. The method of claim 4, wherein the read operation comprises:
determining if current is flowing to the data line pillar.

6. The method of claim 5, wherein the read voltage is a first read voltage, wherein the selected memory cell is programmed to a state of more than two possible states and wherein the read operation comprises:
driving the selected memory cell with a second read voltage different than the first read voltage to determine the state of the memory cell.

7. A method of performing a write operation on a memory, the memory including a plurality of vertical strings of memory cells over a body semiconductor, the body semiconductor connected to a body pillar, the method comprising:
coupling the body semiconductor to ground by connecting the body pillar to ground;
uncoupling the body semiconductor from ground; and
programming a selected memory cell of one of the vertical strings of memory cells to a state of a plurality of states.

8. The method of claim 7, wherein programming the selected memory cell includes tunnel injecting charge carriers onto a charge storage structure of the selected memory cell, wherein the charge storage structure is separated from a respective access line by an insulator.

9. A method of performing an operation on a memory, the memory including a plurality of vertical strings of memory cells over a body semiconductor, the body semiconductor connected to a body pillar, the method comprising:
coupling the body semiconductor to ground by connecting the body pillar to ground;
uncoupling the body semiconductor from ground; and
performing the operation on a selected memory cell of a selected vertical string of memory cells of the plurality of vertical strings of memory cells.

10. The method of claim 9, wherein the operation includes a read operation and the read operation comprises:
reading the contents of a selected memory cell of a selected vertical string of memory cells of the plurality of vertical strings of memory cells.

11. The method of claim 10, wherein the operation includes a read operation and the read operation comprises:
selecting an access line electrically coupled to the selected vertical string of memory cells of the multiple vertical strings of memory cells.

12. The method of claim 10, wherein the read operation further comprises:
driving an unselected memory cell of the selected vertical string of memory cells with a pass voltage.

13. The method of claim 12, wherein the read operation further comprises:
driving the selected memory cell with a read voltage lower than the pass voltage.

14. The method of claim 13, wherein the read operation comprises:
determining if current is flowing to the data line pillar.

15. The method of claim 14, wherein the read voltage is a first read voltage, wherein the selected memory cell is programmed to a state of more than two possible states and wherein the read operation comprises:
driving the selected memory cell with a second read voltage different than the first read voltage to determine the state of the memory cell.

16. The method of claim 9, wherein the operation includes a program operation and the program operation comprises:
programming a selected memory cell of one of the vertical strings of memory cells to a state of a plurality of states.

17. The method of claim 16, wherein programming the selected memory cell includes tunnel injecting charge carriers onto a charge storage structure of the selected memory cell, wherein the charge storage structure is separated from a respective access line by an insulator.

* * * * *